(12) United States Patent
Anand et al.

(10) Patent No.: US 8,922,222 B2
(45) Date of Patent: Dec. 30, 2014

(54) SYSTEMS AND METHODS FOR DETERMINING ELECTRICAL CONNECTIVITY

(75) Inventors: Anisha Anand, Tomball, TX (US); Gordon J. Chambers, Cypress, TX (US); John Hua, Houston, TX (US); Orville H. Orr, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 255 days.

(21) Appl. No.: 13/698,002

(22) PCT Filed: Jun. 18, 2010

(86) PCT No.: PCT/US2010/031988
§ 371 (c)(1),
(2), (4) Date: Nov. 14, 2012

(87) PCT Pub. No.: WO2011/159315
PCT Pub. Date: Dec. 22, 2011

(65) Prior Publication Data
US 2013/0063153 A1     Mar. 14, 2013

(51) Int. Cl.
| | | |
|---|---|---|
| *G01R 31/04* | (2006.01) | |
| *G01R 31/00* | (2006.01) | |
| *H02B 1/26* | (2006.01) | |
| *H02B 1/20* | (2006.01) | |
| *G06F 1/26* | (2006.01) | |
| *G01R 31/02* | (2006.01) | |
| *G06F 11/30* | (2006.01) | |

(52) U.S. Cl.
CPC ............... *G06F 1/26* (2013.01); *G01R 31/024* (2013.01); *G01R 31/026* (2013.01); *H02B 1/20* (2013.01); *G06F 11/3055* (2013.01); *H01L 11/3058* (2013.01)

USPC ........ 324/538; 324/756.05; 361/624; 361/637

(58) Field of Classification Search
USPC ............... 324/500, 537, 538, 756.01, 756.05; 361/611, 624, 637, 639, 648, 675, 775
See application file for complete search history.

(56) References Cited

U.S. PATENT DOCUMENTS 5,549,646 A * 8/1996 Katz et al. ................. 607/8
6,327,157 B1  12/2001 Mann et al.
(Continued)

FOREIGN PATENT DOCUMENTS

| CN | 2886894 | 4/2007 |
| JP | 8154337 | 6/1996 |
| JP | 2009100574 | 5/2009 |

OTHER PUBLICATIONS

International Searching Authority, The International Search Report and the Written Opinion, Feb. 25, 2011, 9 Pages.

(Continued)

*Primary Examiner* — Hoai-An D Nguyen
(74) *Attorney, Agent, or Firm* — Taroli, Sundheim, Coves & Tummino L.L.P.; Christopher P. Harris

(57) ABSTRACT

A system (10) and method (200) are disclosed for detecting electrical connectivity. The system includes at least one power distribution conductor (18) and at least one electrical power pad (20) comprising a detection pad (28) that is electrically isolated from a remaining portion of the respective at least one electrical power pad (20). A measured parameter at the detection pad (28) provides an indication of electrical connectivity between the at least one power distribution conductor (18) and the respective at feast one electrical power pad (20).

15 Claims, 3 Drawing Sheets

(56) References Cited

U.S. PATENT DOCUMENTS

| | | |
|---|---|---|
| 7,027,293 B2 | 4/2006 | Yang et al. |
| 7,307,437 B1 * | 12/2007 | Dobbs et al. .............. 324/750.25 |
| 7,905,997 B2 * | 3/2011 | Groll et al. ............... 204/403.02 |
| 8,206,186 B2 * | 6/2012 | Kisic et al. .................... 439/709 |
| 2002/0162039 A1 | 10/2002 | Kirker et al. |
| 2006/0200688 A1 | 9/2006 | Tofigh et al. |
| 2006/0278538 A1 * | 12/2006 | Groll et al. ................. 205/777.5 |
| 2006/0284655 A1 | 12/2006 | Li et al. |
| 2007/0166595 A1 * | 7/2007 | Akiyama et al. ................ 429/34 |
| 2007/0240017 A1 | 10/2007 | Takahashi |
| 2008/0204037 A1 * | 8/2008 | Fukami ......................... 324/537 |
| 2008/0265250 A1 | 10/2008 | Huang et al. |
| 2009/0189455 A1 | 7/2009 | Rusan et al. |
| 2010/0027169 A1 | 2/2010 | Knott et al. |
| 2010/0038133 A1 | 2/2010 | Senk et al. |
| 2014/0168845 A1 * | 6/2014 | Charles ......................... 361/104 |

OTHER PUBLICATIONS

German Office Action cited in Appl. No. 112010005672.2 dated Feb. 12, 2014; 8 pages.

* cited by examiner

SYSTEMS AND METHODS FOR DETERMINING ELECTRICAL CONNECTIVITY

BACKGROUND

Electrical power car be distributed to computer systems, such as to a plurality of printed circuit boards (PCBs), so a variety of manners. As an example, electrical power distribution conductors, such as busbars, may be connected to a PCB using soldered and/or mechanical means to provide high-current power to the computer system(s). The quality and reliability of the electrical contact is dependent on the contact or manner in which the power distribution conductor its connected to the PCB, such as based on specific amounts of solder or screw torque. Thus, sufficient contact of the power distribution conductor with the computer system(s) can be necessary for sufficient operational reliability and safety.

DETAILED DESCRIPTION

Figure 1:
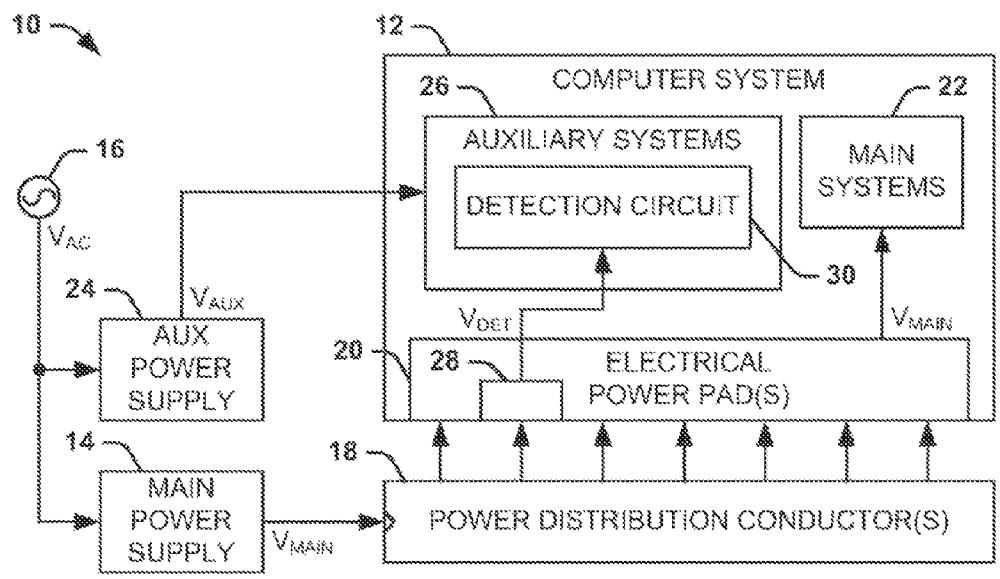
FIG. 1 illustrates an example embodiment of a computer power system.

FIG. 1 illustrates an example embodiment of a computer power system 10. The computer power system 10 includes a computer system 12 that receives a main power voltage $V_{MAIN}$ as a source of power for operation. As an example, the computer system 12 can be a computer or a server having at least one printed circuit board (PCB). In the example of FIG. 1, a main power supply 14 generates the main power voltage $V_{MAIN}$ from an AC voltage $V_{AC}$ that is generated by an AC-power supply 16.

In the example of FIG. 1, the main power supply 14 provides the main power voltage $V_{MAIN}$ to at least one power distribution conductor 18. Thus, at least one power distribution conductor 18 is held at a voltage potential that is approximately equal to the main power voltage $V_{MAIN}$. As an example, the at least one power distribution conductor 18 can be a busbar or any of a variety of electrical conductors configured to carry high-current power to the computer system 12, as well as to one or more additional computer systems. The computer system 12 thus includes one or more electrical power pads 20 that are electro-mechanically coupled to the power distribution conductor(s) 18 to allow the computer system 12 to receive the main power voltage $V_{MAIN}$.

For example, the electrical power pad(s) 20 can include a first electrical power pad 20 that is coupled to a first power distribution conductor 18 for providing the main power voltage $V_{MAIN}$ and a second electrical power pad 20 that is coupled to a second power distribution conductor 18 for providing a neutral voltage (e.g., ground) with respect to the main power voltage $V_{MAIN}$. It is to be appreciated that other power distribution conductors can be provided to supply other voltage levels. The electro-mechanical coupling of the electrical power pad(s) 20 to the power distribution conductor(s) 18 can include one or more of mating pins, plugs, solder, screws, welds, fasteners, or a variety of other means of mechanical contact. It is to be understood that the coupling of the electrical power pad(s) 20 and the power distribution conductor(s) 18 can be either coupling of the electrical power pad(s) 20 to the power distribution conductor(s) 18 or coupling of the power distribution conductor(s) 18 to the electrical power pad(s) 20.

The main power voltage $V_{MAIN}$ is provided as a power source from the electrical power pad(s) 20 to main systems 22 of the computer system 12. The main systems 22 can include the majority of functional hardware systems for operation of the computer system 12, such as the basic input/output system (BIOS) of the computer system 12. The main systems 22 can thus be activated at startup of the computer system 12. The computer power system 10 also includes an auxiliary power supply 24 that generates an auxiliary voltage $V_{AUX}$ from the AC voltage $V_{AC}$. In the example of FIG. 1, the auxiliary power supply 24 is demonstrated as separate from the main power supply 14, but it is to be understood that the auxiliary voltage $V_{AUX}$ and the main power voltage $V_{MAIN}$ could be generated from the same power supply. The auxiliary voltage $V_{AUX}$ is provided to auxiliary systems 26 of the computer system 12. As an example, the auxiliary systems 26 can include functional systems of the computer system 12 that are operation even when the main power voltage $V_{MAIN}$ is not provided to the computer system 12, such as clocks, memory, and a variety of other background functionality of the computer system 12.

For reliable operation of the main systems 22 of the computer system 12 and for potential safety reasons, it may be necessary to ensure that there is sufficient connectivity between the electrical power pad(s) 20 and the power distribution conductor(s) 18. Therefore, each of the electrical power pad(s) 20 can include a detection pad 28. The detection pad 28 can be a conducting portion of the electrical power pad(s) 20 that is electrically isolated from the remaining portions of the electrical power pad(s) 20. As described herein, the term "detection pad", can include any portion of the electrical power pad(s) 20 that is electrically isolate from the remaining portions of the electrical power pad(s) 20 and can likewise be electrically connected to the power distribution conductor(s) 18, such as a pin, wire, flat conductive portion, raised solder-pad, lead, of any of a variety of other electro-mechanical coupling means. Electrical connectivity of the respective power distribution conductor(s) 18 to the electrical power pad(s) 20 can thus provide an electrical connection, such as a short-circuit, between the detection pad 28 and the electrical power pad(s) 20. As a result, a parameter associated with the detection pad 28 can be measured to determine electrical connectivity between the power distribution conductor(s) 18 and the electrical power pad(s) 20.

The auxiliary systems 26 include a detection circuit 30 that is configured to monitor the detection pad to determine electrical connectivity between the power distribution conductor(s) 18 and the electrical power pad(s) 20. Specifically, in the example of FIG. 1, the detection circuit 30 monitors a voltage $V_{DET}$ of the detection pad 28. As an example, if the voltage $V_{DET}$ has a magnitude that is approximately equal to the main power voltage $V_{MAIN}$ when the main power supply 14 is activated, then the detection circuit 30 can determine that there is electrical connectivity between the power distribution conductor(s) 18 and the electrical power pad(s) 20. As another example, if the voltage $V_{DET}$ has a magnitude that is approximately zero when the main power supply 14 is deactivated, then electrical connectivity can likewise be determined.

The detection circuit 30 can include one or more threshold voyages, such as generated from the auxiliary voltage $V_{AUX}$, with which the voltage $V_{DET}$ can be compared to determine connectivity. As yet another example, the detection circuit 30 can be configured to couple a reference voltage to the detection pad 28 that changes in response to electrical connectivity between the electrical power pad(s) 20 and the power distribution conductor(s) 18. Thus, the detection circuit 30 can detect a lack of electrical connectivity between the electrical power pad(s) 20 and the power distribution conductor(s) 18 based on determining that the voltage $V_{DET}$ has a magnitude that is approximately equal to the reference voltage. As described herein, "lack of electrical connectivity" describes a condition in which there is not proper electrical connectivity between the electrical power pad(s) 20 and the power distribution conductor(s) 18, such as based on an open-circuit or insufficient electro-mechanical contact which results in an insufficient voltage at the electrical power pad(s) 20.

As another example, upon determining that the voltage $V_{DET}$ has a magnitude that is outside a desired threshold range of the detection reference voltage(s), the detection circuit 30 can determine that there is a lack of connectivity between the electrical power pad(s) 20 and the power distribution conductor(s) 18. In response, the detection circuit 30 can perform a variety of actions, such as posting a fault indication, and/or disabling the computer system 12. Furthermore, as described above, the detection circuit 30 is part of the auxiliary systems 26, and thus operates based on the auxiliary voltage $V_{AUX}$. Therefore, the detection circuit 30 can prevent startup of the computer system 12, such as based on prohibiting coupling of the main power voltage $V_{MAIN}$ to the main systems 22 at initialization of the computer system 12, upon detecting sack of connectivity between the electrical power pad(s) 20 and the power distribution conductor(s) 18.

The detection circuit 30 can therefore ensure reliable operation of the computer system 12 based on detecting the electrical connectivity between the electrical power pad(s) 20 end the power distribution conductor(s) 18. Specifically, the detection circuit 30 can determine that there is sufficient connectivity regardless of the electro-mechanical means of connection between the electrical power pad(s) 20 and the power distribution conductor(s) 18 through the operational lifetime of the computer system 12. Furthermore, because the detection circuit 30 can operate when the computer system 12 is deactivated, the detection circuit 30 can prevent startup of the computer system 12 when there is a lack of connectivity between the electrical power pad(s) 20 and the power distribution conductor(s) 18. Accordingly, the defection circuit 30 can also ensure that the startup of the computer system 12 is sale for both users and the computer system 12. As described herein, the term "deactivated" with aspect to the computer system 12 describes a condition in which the auxiliary voltage $V_{AUX}$ is provided to the auxiliary systems 26 but the main systems 22 are not receiving the main power voltage $V_{MAIN}$, and are thus inactive, such as when a personal computer is plugged-in to receive power but has not yet been turned on.

Figure 2:
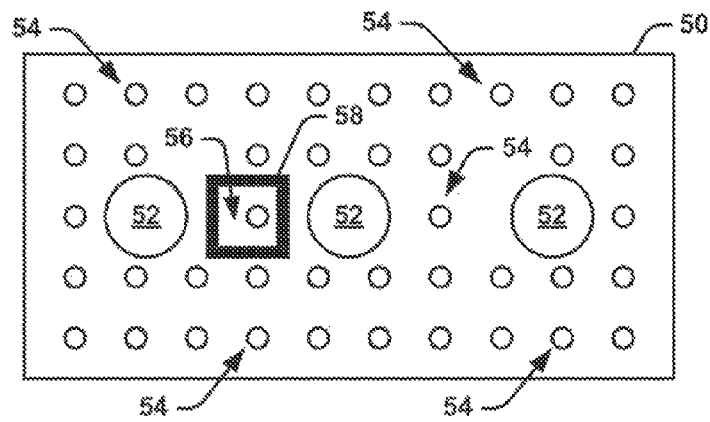
FIG. 2 illustrates an example embodiment of an electrical power pad.

FIG. 2 illustrates an example embodiment of an electrical power pad 50. The electrical power pad 50 can represent one of the one or more electrical power pads 20 in the example of FIG. 1. Therefore, the electrical power pad 50 can be configured to be coupled to a power distribution conductor, such as a busbar, to provide electrical contact of one of the main power voltage $V_{MAIN}$ and neutral voltage, such as ground, for powering an associated computer system.

In the example of FIG. 2, the electrical power pad 50 includes three screw-holes 52 for mechanically coupling the electrical power pad 50 to the associated power distribution conductor. The screw-holes 52 can also provide electrical connectivity between the electrical power pad 50 and the power distribution conductor. In addition, the electrical power pad 50 includes a plurality of raised solder-pads 54. The raised solder-pads 54 provide additional electrical connectivity between the electrical power pad 50 and the power distribution conductor. In addition, the raised solder-pads 54 can be coupled to vias (not shown) that extend from the opposite side of the electrical power pad 50 to which the power distribution conductor is coupled to the electrical power pad 50. As an example, the vias can extend into one or more layers of PCB of a computer system.

In the example of FIG. 2, the electrical power pad 50 includes a detection pad 56. As an example, the detection pad 56 can be a conducting portion of the electrical power pad 50 that is electrically isolated from the remaining portions of the electrical power pad 50. In the example of FIG. 2, the electrical isolation is based on a cut-away section 58 of the electrical power pad 50, such that the cut-away section 58 creates an open-circuit between the defection pad 56 and the remaining portions of the electrical power pad 50. It is to be understood that other manners of electrical isolation, such as insulating barriers, can be implemented instead of the cut-away section 58. The detection pad 58 includes one or more raised solder-pads 54 through which the detection pad 56 can establish electrical connectivity with the power distribution conductor and/or through which the detection circuit can measure the voltage $V_{DET}$.

The defection pad 56 can thus be a portion of the electrical power pad 50 that can be monitored to determine electrical connectivity between the electrical power pad 50 and an associated power distribution conductor. Specifically, the defection pad 56 can be dimensionally flush with the surface of the remaining portions of the electrical power pad 50, such that an associated power distribution conductor can contact both the detection pad 56 and the remaining portions of the electrical power pad 50. Therefore, electro-mechanical contact of the electrical power pad 50 with the associated power distribution conductor provides an electrical connection, such as a short-circuit, between the detection pad 56 and the remaining portions of the electrical power pad 50. As a result, a detection circuit can measure a parameter, such as a voltage, at the detection pad 56 to determine sufficient electrical connectivity of the power distribution conductor with the electrical power pad 50. In addition, the detection pad 56 can be located within an outer geometry of the electrical power pad 50 (i.e., near an approximate central location of the electrical power pad 50), as demonstrated in the example of FIG. 2. Thus, an associated power distribution conductor does not need to be modified to implement the power detection system and methodology described herein.

It is to be understood that the electrical power pad 50 is not intended to be limited to the example of FIG. 2. As an example, the electrical power pad 50 is not limited to electrical and/or mechanical contact with the associated power distribution conductor via the screw-holes 52 and the raised solder-pads 54, but could just implement a single one of the screw-holes 52 and raised solder-pads 54, or could include any of a variety of other electro-mechanical coupling means. Furthermore, the electrical power pad 50 can include multiple conductive portions located in various places across the electrical power pad 50 that are each separately monitored to determine electrical connectivity substantially uniformly across the electrical power pad 50. Accordingly, the electrical power pad 50 can be configured in a variety of ways.

Figure 3:
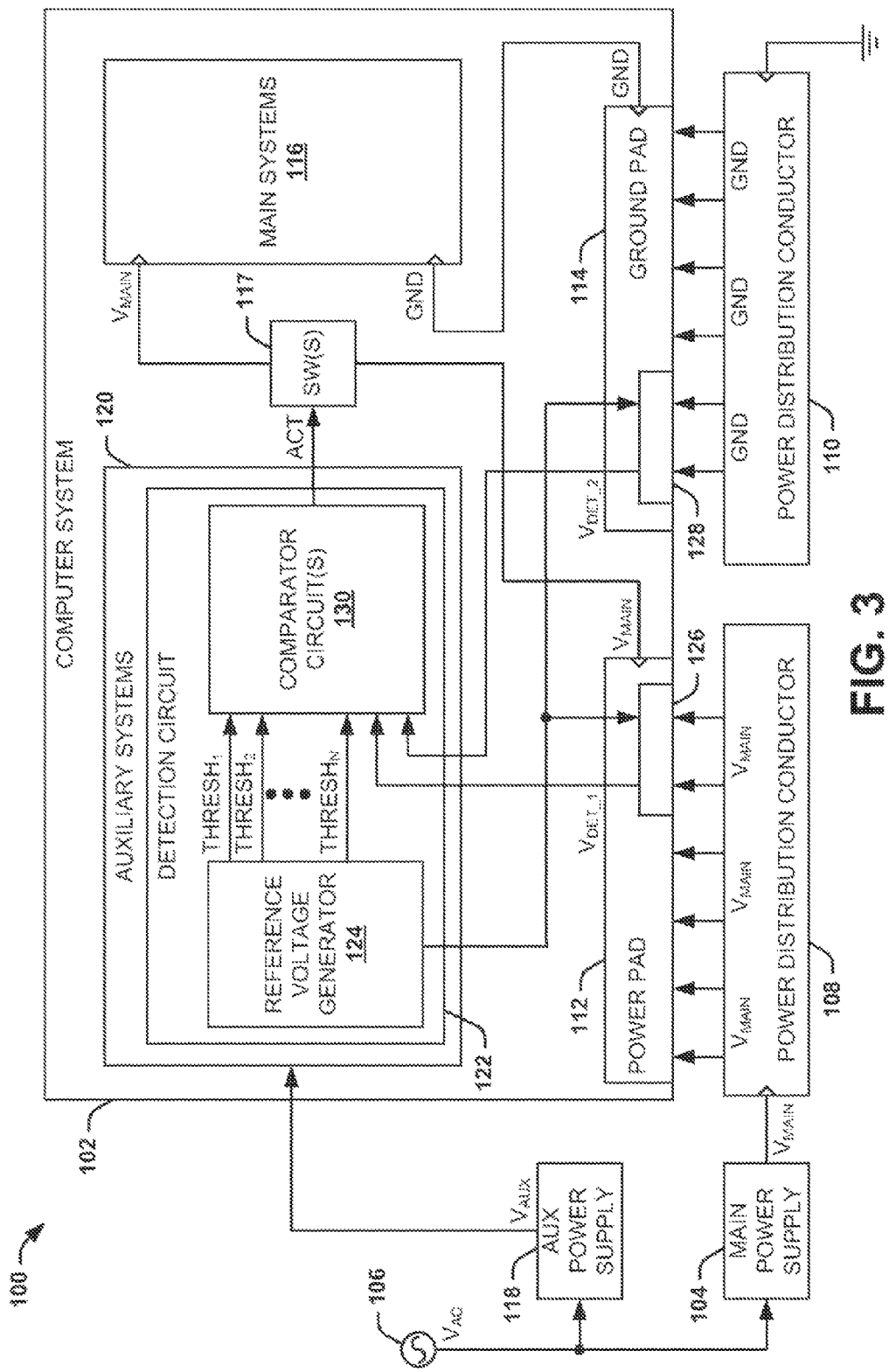
FIG. 3 illustrates another example embodiment of a computer power system.

FIG. 3 illustrates another example embodiment of a computer power system 100. The computer power system 100 includes a computer system 102 that receives a main power voltage $V_{MAIN}$ as a source of power for operation. As an example, the computer system 102 can be a computer or a server having at least one PCB. In the example of FIG. 3, a main power supply 104 generates the main power voltage $V_{MAIN}$ from an AC voltage $V_{AC}$ that is generated by an AC-power supply 106. As an example, the voltage $V_{MAIN}$ can be a DC voltage having a magnitude of approximately 12 volts.

In the example of FIG. 3, the main power supply 104 provides the main power voltage $V_{MAIN}$ to a first power distribution conductor 108. In addition, the computer power system 100 also includes a second power distribution conductor 110 that is coupled to a neutral voltage, which is demonstrated as ground in the example of FIG. 3. The neutral voltage can be any of a variety of voltage potentials less than the main power voltage $V_{MAIN}$ which together provide a voltage potential difference. As an example, the power distribution conductors 108 and 110 can be busbars or any of a variety of electrical conductors configured to carry high-current power to the computer system 102, as well as to one or more additional similarly configured computer systems. In addition, the computer system 102 includes a first electrical power pad 112 that is electro-mechanically coupled to the first power distribution conductor 108 and a second ground pad 114 that is electro-mechanically coupled to the second power distribution conductor 110. The electrical power pads 112 and 114 thus allow the computer system 12 to receive the main power voltage $V_{MAIN}$. As an example, each of the electrical power pads 112 and 114 can be configured substantially similar to the electrical power pad 50 in the example of FIG. 2, and can include any of a variety of mechanisms of providing the electro-mechanical coupling to the respective power distribution conductors 108 and 110.

The main power voltage $V_{MAIN}$ and associated ground, demonstrated in the example of FIG. 3 as GND, are provided as a power source from the electrical power pads 112 and 114 to main systems 116 of the computer system 102. In the example of FIG. 3, the main power voltage $V_{MAIN}$ is provided to the main systems 116 via one or more switches 117, demonstrated as SW(S) in the example of FIG. 3 and described in greater detail below. Similar to as described above in the example of FIG. 3, the main systems 116 can include the majority of functional hardware systems for operation of the computer system 102, and can thus be activated at startup of the computer system 102. The computer power system 100 also includes an auxiliary power supply 118 that generates an auxiliary voltage $V_{AUX}$ from the AC voltage $V_{AC}$. The auxiliary voltage $V_{AUX}$ is provided to auxiliary systems 120 of the computer system 102. Similar to as described above in the example of FIG. 1, the auxiliary systems 120 can include functional systems of the computer system 102 that are operational even when the main power voltage $V_{MAIN}$ is not provided to the computer system 102.

The auxiliary systems 120 include a defection circuit 122 that is configured to determine electrical connectivity between the electrical power pads 112 and 114 and the respective power distribution conductors 108 and 110. In the example of FIG. 3, the detection circuit 122 includes a reference voltage generator 124 that is configured to generate a reference voltage $V_{REF}$ and threshold voltages $THRESH_1$ through $THRESH_N$ based on the auxiliary voltage $V_{AUX}$, where N is a positive integer. As an example, the reference voltage $V_{REF}$ can have a magnitude that is between the main voltage $V_{MAIN}$ and zero and can be generated based on a low current source, such as through a large resistance. The threshold voltages $THRESH_1$ through $THRESH_N$ can represent a set of voltages which define acceptable and/or unacceptable ranges of magnitudes associated with the main power voltage $V_{MAIN}$ and ground.

In the example of FIG. 3, the electrical power pad 112 includes a detection pad 126 and the ground pad 114 includes a detection pad 128. As an example, the detection pads 126 and 128 can be electrically isolated from the remaining portions of the respective power pads 112 and 114. The detection pads 128 and 128 can thus be the portions of the respective electrical power pads 112 and 114 that are monitored by the detection circuit 122 to determine electrical connectivity of the power pad 112 with the power distribution conductor 108 and the ground pad 114 with the power distribution conductor 110, respectively. Specifically, the detection circuit 122 can measure a voltage $V_{DET\_1}$ associated with the detection pad 126 and a voltage $V_{DET\_2}$ associated with the detection pad 128.

In the example of FIG. 3, the reference voltage generator 124 provides the reference voltage $V_{REF}$ to the detection pads 126 and 128. Therefore, when the power distribution conductors 108 and 110 are not electro-mechanically coupled to the power pads 112 and 114, the detection pads 126 and 128 are held at the reference voltage $V_{REF}$. Thus, the voltages $V_{DET\_1}$ and $V_{DET\_2}$ are approximately, equal to the reference voltage $V_{REF}$. However, upon proper electro-mechanical coupling of the power distribution conductors 108 and 110 to the respective power pads 112 and 114, prior to the coupling of ground or the main power voltage $V_{MAIN}$, the detection pads 126 and 128 become electrically connected to the respective power distribution conductors 108 and 110. Thus, the magnitude of the voltages $V_{DET\_1}$ and $V_{DET\_2}$ become approximately equal to zero based on the loading of the power distribution conductors 108 and 110 with respect to the low-current reference voltage $V_{REF}$. Similarly, upon providing the main power voltage $V_{MAIN}$ to the power distribution conductor 108 and coupling the power distribution conductor 110, the voltage $V_{DET\_1}$ becomes appropriately equal to the main power voltage $V_{MAIN}$ and the voltage $V_{DET\_2}$ remains at approximately zero (i.e., ground).

The detection circuit 122 also includes one or more comparator circuits is 130. The comparator circuit(s) 130 are configured to compare the magnitude of the voltages $V_{DET\_1}$ and $V_{DET\_2}$ with the threshold voltages $THRESH_1$ through $THRESH_N$. Specifically, the comparator circuit(s) 130 can determine that there is electrical connectivity of the power pad 112 with the power distribution conductor 108 if the voltage $V_{DET\_1}$ has a magnitude that is within the threshold range of desired values that is defined by the threshold voltages $THRESH_1$ through $THRESH_N$ (e.g., approximately equal to the main power voltage $V_{MAIN}$). Similarly, the comparator circuit(s) 130 can determine that there is electrical connectivity of the power pad 114 with the power distribution conductor 110 if the voltage $V_{DET\_2}$ has a magnitude that is within the threshold range of desired values that is defined by the threshold voltages $THRESH_1$ through $THRESH_N$ (e.g., approximately equal to ground). However, the comparator circuit(s) 130 can determine a lack of electrical connectivity between the power pads 112 and 114 and the respective power distributors conductors 108 and 110 if either of the respective voltages $V_{DET\_1}$ and $V_{DET\_2}$ have a magnitude that is approximately equal to the reference voltage $V_{REF}$ based on a comparison with the threshold voltages $THRESH_1$ through $THRESH_N$.

In response to determining electrical connectivity between the power pads 112 and 114 and the respective power distribution conductors 108 and 110, the comparator circuit(s) 130 can generate one or more signals ACT that close the switch (es) 117. Therefore, the main power voltage $V_{MAIN}$ provided to the main systems 116 to allow the main systems 110 to operate or continue to operate. However, upon the comparator circuit(s) 130 determining a lack of electrical connectivity between the power pads 112 and 114 and the respective power distribution conductors 108 and 110, the comparator circuit (s) 130 can set the signal(s) ACT to open the switch(es) 117. Thus, upon the switch(es) 117 opening, the main power voltage $V_{MAIN}$ removed from the main systems 116, thus substantially disabling the computer system 102.

The detection circuit 122 can be configured to operate at any time that it receives the auxiliary voltage $V_{AUX}$, such as when the computer system 102 is deactivated. Therefore, the detection circuit 122 can monitor connectivity between the power pads 112 and 114 and line respective power distribution conductors 108 and 110 before startup of the computer system 102. Therefore, the detection circuit 122 can ensure that there is sufficient connectivity of the power pad 112 and the ground pad 114 with the respective power distribution conductors 108 and 110 before activation of the computer system 102. Specifically, upon defecting that there is insufficient connectivity of the power pad 112 and the ground pad 114 with the respective power distribution conductors 108 and 110, the switch(es) 117 can be open to prevent the main systems 116 from receiving the main power voltage $V_{MAIN}$, and thus preventing startup of the computer system 102. Therefore, the detection circuit 122 can substantially mitigate unsafe startup of the computer system 102 to substantially mitigate damage to the components of the main systems 116 and to substantially mitigate possible harm to users.

It is to be understood that the computer power system 100 is not intended to be limited to the example of FIG. 3. As an example, the signal ACT can be configured to activate one or more fault indicators that operate on the auxiliary voltage $V_{AUX}$ in addition to controlling the switch(es) 117. As another example, the power pad 112 and the ground pad 114 can include additional detection pads, such that the comparator circuit(s) 130 can monitor connectivity of each of the power pad 112 and/or the ground pad 114 substantially uniformly over the respective surfaces. As yet another example, the computer system 102 can include more than one of each of the power pad 112 and the ground pad 114 that can each be monitored by the detection circuit 122 for connectivity with the respective power distribution conductors 108 and 110. Furthermore, the comparator circuit(s) 130 can be configured to measure the voltages $V_{DET\_1}$ and $V_{DET\_2}$ both before and after providing the main power voltage $V_{MAIN}$ and ground on the respective power distribution conductors 108 and 110. Thus, the comparator circuit(s) 130 can determine electrical connectivity based on the voltages $V_{DET\_1}$ and $V_{DET\_2}$ having a magnitude that is approximately equal to zero prior to providing the main power voltage $V_{MAIN}$ and ground on the respective power distribution conductors 108 and 110. Accordingly, the computer power system 100 can be configured in a variety of ways.

Figure 4:
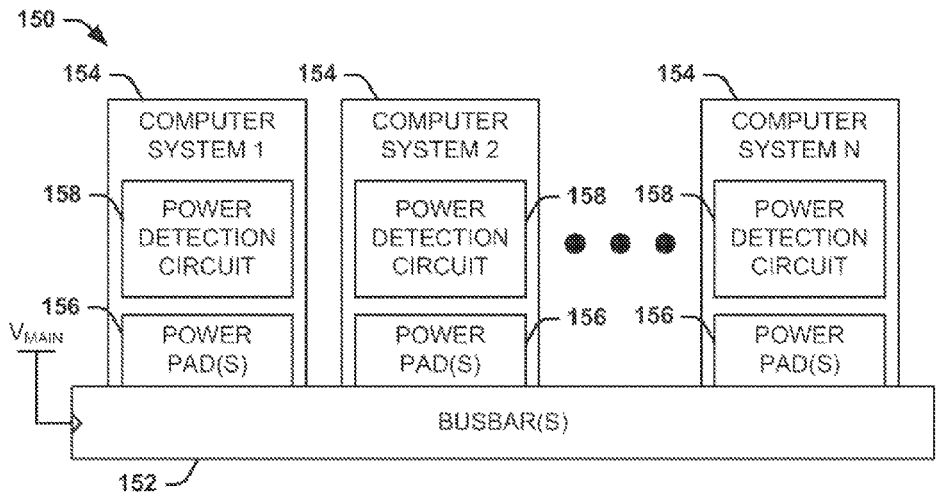
FIG. 4 illustrates yet another example embodiment of a computer power system.

FIG. 4 illustrates yet another example embodiment of a computer power system 150. As an example, the computer power system 150 can be implemented in a server or other computer environment, such as to provide power to a plurality of computer systems. Specifically, the example of FIG. 4 demonstrates one or more busbars 152 providing the main power voltage $V_{MAIN}$ to a plurality N of computer systems 154, where N is an integer greater than one. Each of the computer systems 154 can be configured substantially the same as the computer system 102 in the example of FIG. 3. Thus, the busbar(s) 152 can include a first power distribution conductor that provides the main power voltage $V_{MAIN}$ and a second power distribution conductor that provides a neutral connection to each of the computer systems 154.

Each of the computer systems 154 includes one or more respective power pads 156 that couple to the busbar(s) 152. The power pad(s) 156 can be configured substantially similar to the electrical power pad 50 in the example of FIG. 2, such that each of the power pad(s) 56 includes a detection pad. Each of the computer systems 152 also includes a detection circuit 158, which can be configured substantially similar to the detection circuit 122 in the example of FIG. 3. Therefore, each of the detection circuits 158 can be configured to monitor connectivity of the power pad(s) 156 with the respective busbar(s) 152, such as based on measuring a parameter such as voltage as the respective detection pads of the power pad(s) 156.

As an example, the defection circuits 158 can operate based on an auxiliary voltage that is separate from the main power voltage $V_{MAIN}$. Therefore, upon an individual one of the detection circuits 158 determining a lack of connectivity between the power pad(s) 156 and the respective busbar(s) 152, the respective defection circuit 158 can disable the respective computer system 154. For example, the detection circuit 158 can remove the main power voltage $V_{MAIN}$ from main systems of the computer system 154 during operation of the computer system 154. As another example, the detection circuit 158 can prevent startup of the computer system 154 prior to activation of the respective computer system 154.

Figure 5:
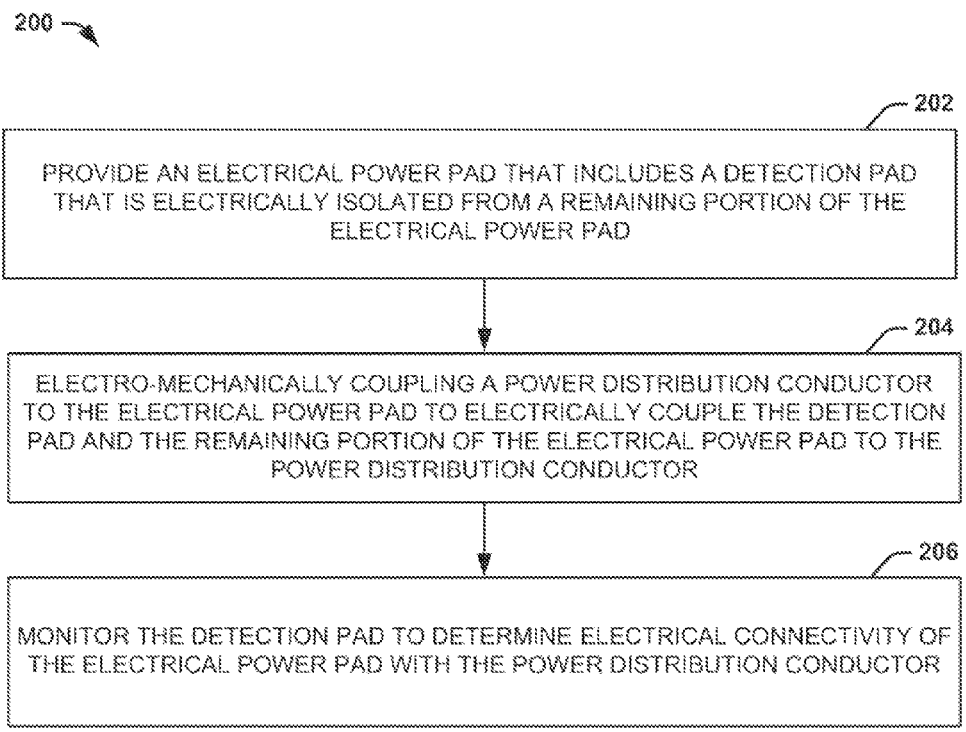
FIG. 5 illustrates an example embodiment of a method for detecting electrical connectivity.

In view of the foregoing structural and functional features described above, an example methodology will be better appreciated with reference to FIG. 5. While, for purposes of simplicity of explanation, the methodology of FIG. 5 is shown and described as executing serially, it is to be understood and appreciated that the present invention is not limited by the illustrated order, as some embodiments could in other embodiments occur in different orders and/or concurrently from that shown and described herein.

FIG. 5 illustrates an example embodiment of a method 200 for detecting electrical connectivity. At 202, an electrical power pad is provided that includes a detection pad that is electrically isolated from a remaining portion of an electrical power pad. At 204, a power distribution conductor is electromechanically coupled to the electrical power pad to electrically couple the defection pad and the remaining portion of electrical power pad to the power distribution conductor. At 206, the defection pad is monitored to determine electrical connectivity of the electrical power pad with the power distribution conductor.

What have been described above are examples or the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A system (10) for detecting electrical connectivity comprising:
   at least one power distribution conductor (18); and
   at least one electrical power pad (20) comprising a detection pad (28) that is electrically isolated from a remaining portion of the respective at least one electrical power pad (20), wherein a measured parameter at the detection pad (28) provides an indication of electrical connectivity between the at least one power distribution conductor (18) and the respective at least one electrical power pad (20).

2. The system of claim 1, further comprising a defection circuit (30) configured to compare the measured parameter with a predetermined value to determine electrical connectivity between the at least one electrical power pad (20) and the respective at least one power distribution conductor (18).

3. The system of claim 2, wherein the measured parameter is a voltage at the detection pad (28).

4. The system of claim 3, further comprising a reference voltage generator (124) powered by an auxiliary voltage that is generated separate from the main power voltage, the reference voltage generator (124) being configured to generate a reference voltage that is coupled to the detection pad (28), the detection circuit (30) detecting lack of electrical connectivity in response to measuring the reference voltage at the detection pad (28) and detecting electrical connectivity in response to measuring a voltage associated with the at least one power distribution conductor (18).

5. The system of claim 2, wherein the measured parameter that determines electrical connectivity is a main power voltage when the main power voltage is provided to the at least one power distribution conductor (18) and is a neutral voltage when the main power voltage is not provided to the at least one power distributor conductor (18).

6. The system of claim 5, wherein the power detection is configured to prevent startup of an associated computer system (12) in response to detecting a lack of the electrical connectivity between the at least one electrical power pad (20) and the respective at least one power distribution conductor (18).

7. The system of claim 1, wherein the defection pad (28) is electrically shorted to the remaining portion of the respective at least one electrical power pad (20) upon proper electro-mechanical coupling of the at least one electrical power pad (20) and the at least one power distribution conductor (28).

8. A method (200) for detecting electrical connectivity, the method comprising:
providing an electrical power pad (20) that includes a detection pad (28) that is electrically isolated from a remaining portion of an electrical power pad (20);
electro-mechanically coupling a power distribution conductor (18) to the electrical power pad (20) to electrically couple the detection pad (28) and the remaining portion of electrical power pad (20) to the power distribution conductor (18); and
monitoring the defection pad (28) to determine electrical connectivity of the electrical power pad (20) with the power distribution conductor (18).

9. The method of claim 8, wherein the determining electrical connectivity comprises measuring a voltage at the defection pad (28) and determining electrical connectivity of the electrical power pad (20) with the power distribution conductor (18) upon the voltage being within a desired threshold range of a voltage associated with the power distribution conductor (18).

10. The method of claim 9, further comprising:
generating a reference voltage based on the auxiliary voltage;
coupling the reference voltage to the detection pad (28); and
detecting a lack of the electrical connectivity of the electrical power pad (20) with the power distribution conductor (18) upon the voltage being approximately equal to the reference voltage.

11. The method of claim 10, further comprising preventing startup of an associated computer system (12) using the voltage associated with the power distribution conductor (18) based on the auxiliary voltage and in response to detecting a lack of the electrical connectivity.

12. A system (10) for determining electrical connectivity comprising:
at least one busbar (152) configured to provide a voltage; and
a plurality of computer systems (154), each of the plurality of computer systems (154) comprising:
at least one electrical pad (156) that is configured to be coupled with the respective at least one busbar (152) to provide the voltage to the respective computer system (154), each of the at least one electrical power pad (156) comprising a detection pad (128) that is electrically isolated from a remaining portion of the respective at least one electrical power pad (156); and
a detection circuit (30) configured to measure a parameter associated with the detection pad (28) and compare the parameter to a desired threshold range to determine electrical connectivity between the at least one electrical power pad (156) and the respective at least busbar (152).

13. The system of claim 12, wherein the parameter is at least one voltage.

14. The system of claim 13, wherein at least one of the computer systems (154) comprises a reference voltage generator (124) configured to generate a reference voltage that is coupled to the detection pad (28), the detection circuit (30) detecting lack of the electrical connectivity in response to measuring the reference voltage and detecting electrical connectivity in response to measuring a voltage associated with the at least one busbar (152).

15. The system of claim 12, wherein the detection circuit (30) is configured to prevent startup of the respective computer system (154) in response to detecting a lack of electrical connectivity between the at least one electrical power pad (156) and the respective at least one busbar (152).

* * * * *

UNITED STATES PATENT AND TRADEMARK OFFICE
CERTIFICATE OF CORRECTION

PATENT NO. : 8,922,222 B2
APPLICATION NO. : 13/698002
DATED : December 30, 2014
INVENTOR(S) : Anisha Anand et al.

It is certified that error appears in the above-identified patent and that said Letters Patent is hereby corrected as shown below:

Title Page

Item (86), PCT No., in column 1, line 1, delete "PCT/US2010/031988" and insert -- PCT/US2010/039188 --, therefor.

Item (74), Attorney, in column 2, lines 1-2, delete "Taroli, Sundheim, Coves & Tummino L.L.P." and insert -- Tarolli, Sundheim, Coves & Tummino L.L.P. --, therefor.

In the Claims

In column 9, line 4, in Claim 2, delete "defection" and insert -- detection --, therefor.

In column 9, line 33, in Claim 7, delete "defection" and insert -- detection --, therefor.

In column 9, line 48, in Claim 8, delete "defection" and insert -- detection --, therefor.

In column 9, lines 52-53, in Claim 9, delete "defection" and insert -- detection --, therefor.

In column 10, line 25, in Claim 12, delete "pad" and insert -- power pad --, therefor.

In column 10, line 29, in Claim 12, delete "(128)" and insert -- (28) --, therefor.

Signed and Sealed this
Sixteenth Day of June, 2015

Michelle K. Lee
*Director of the United States Patent and Trademark Office*